United States Patent [19]
Ikeda

[11] Patent Number: 5,342,738
[45] Date of Patent: Aug. 30, 1994

[54] RESIST FILM DEVELOPING METHOD AND AN APPARATUS FOR CARRYING OUT THE SAME

[75] Inventor: Rikio Ikeda, Kanagawa, Japan

[73] Assignee: Sony Corporation, Tokyo, Japan

[21] Appl. No.: 894,295

[22] Filed: Jun. 4, 1992

[30] Foreign Application Priority Data

Jun. 4, 1991 [JP] Japan .................................. 3-132852
Jun. 11, 1991 [JP] Japan .................................. 3-139228
Jul. 29, 1991 [JP] Japan .................................. 3-211474

[51] Int. Cl.$^5$ .............................................. G03C 5/00
[52] U.S. Cl. ..................................... 430/325; 430/396; 430/329; 430/330; 430/397; 156/646
[58] Field of Search ............... 430/325, 326, 329, 330, 430/397; 156/646

[56] References Cited

U.S. PATENT DOCUMENTS 4,851,311 7/1989 Millis et al. .......................... 430/325

Primary Examiner—John Kight, III
Assistant Examiner—Dvc Truong
Attorney, Agent, or Firm—Hill, Steadman & Simpson

[57] ABSTRACT

Disclosed is herein a method of developing an exposed resist film formed over a major surface of a substrate, the method comprising: holding the substrate carrying the resist film in contact with the supporting surface of a supporting member, having an area smaller than the surface area of the substrate, and supplying a developer onto the resist film so that the developer is retained in a developer puddle by surface tension on the surface of the resist film to develop the resist film, wherein the substrate carrying the resist film is separated from the supporting member during the progress of the development of the resist film.

17 Claims, 17 Drawing Sheets

F I G. 5a
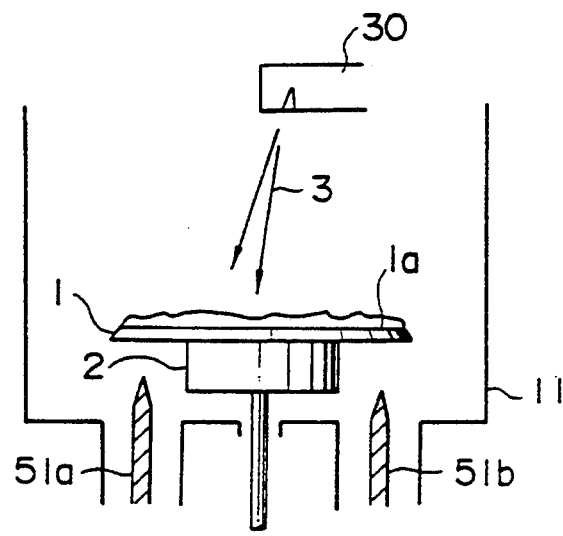
F I G. 5b
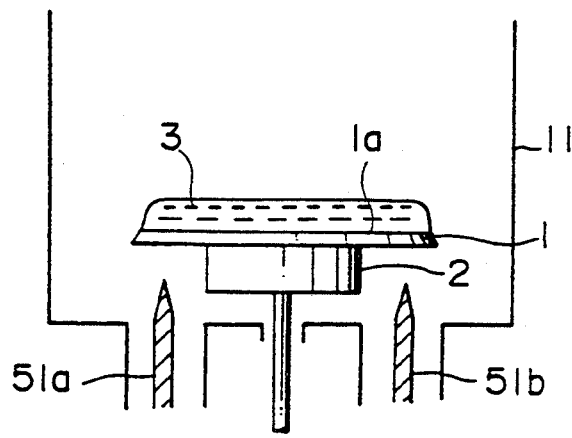
F I G. 5c
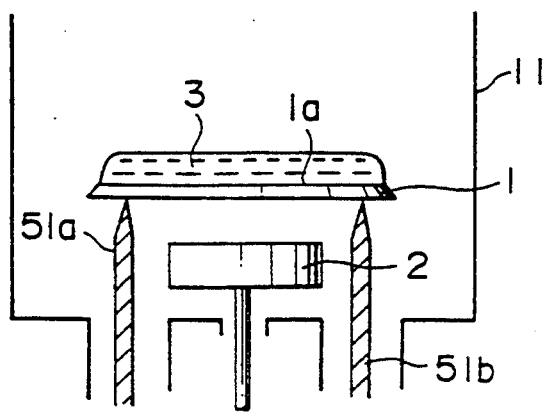

F I G. 7a
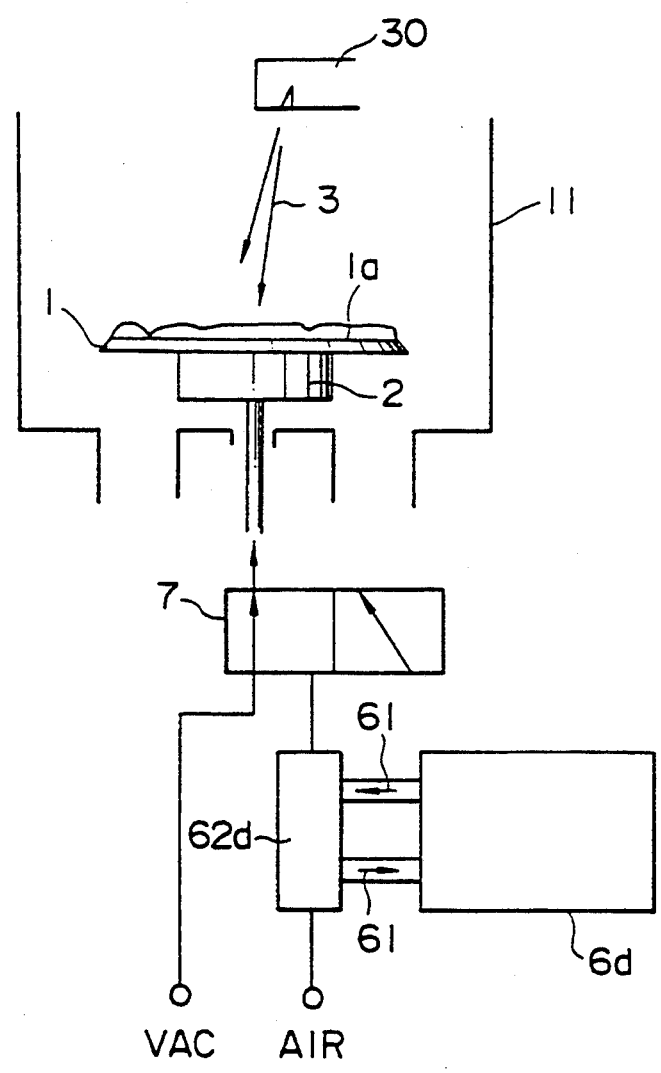

F I G. 12
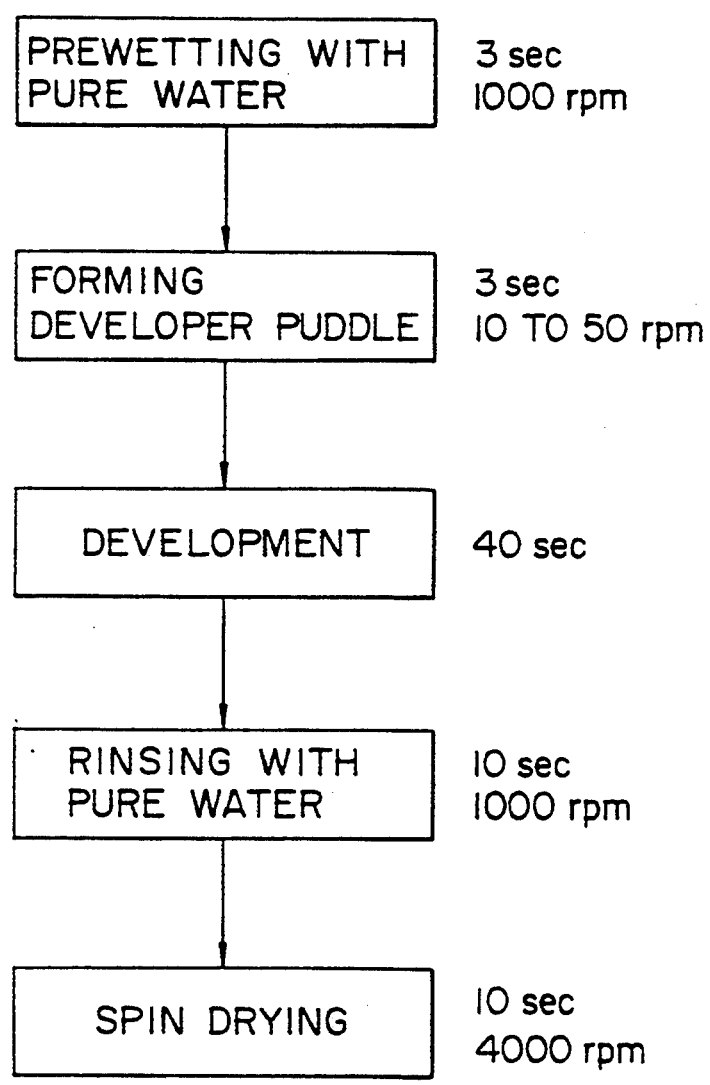

5,342,738

RESIST FILM DEVELOPING METHOD AND AN APPARATUS FOR CARRYING OUT THE SAME

BACKGROUND OF THE INVENTION

1. Field of the Invention

The present invention relates to a resist film developing method and, more particularly, to a method of developing a resist film in a desired pattern in fabricating an electronic device by a photolithographic process, and an apparatus for carrying out the same.

2. Description of the Prior Art

As is generally known, photolithography employing a resist film is applied to fabricating an electronic device, such as a semiconductor device. A puddle developing process is employed in developing an exposed resist film by photolithography. As shown in FIG. 1a and 1b, in developing an exposed resist film 1a formed on a work 1, such as a semiconductor wafer, by a photolithographic process, the work 1 is mounted on a support 2, such as a wafer chuck, supported in a developing cup 11, a developer 3 is spread by a nozzle 30 or the like over the surface of the resist film 1a so that the developer 3 is retained in a puddle by surface tension over the surface of the resist film 1a as shown in FIG. 1b to develop the resist film 1a. In this specification, retaining a developer in a puddle by surface tension over the surface of a work will be designated as "puddling" and a developing process using a developer puddle formed by puddling will be designated as "a puddle developing process".

It is well known that developing speed is dependent on the temperature of the developer, and developing speed affects the width of the component lines of the resist film. (Proceedings of Oyo Butsuri Gakkai, Spring, 1989, 2a-K-2, Proceedings of Oyo Butsuri Gakkai, Autumn, 1989, 29-p-L-10).

The prior art photolithography assumes that the temperature of the developer does not change during development because the developer is retained in a puddle of a thickness on the order of several millimeters on the work and hence the heat capacity of the puddle of the developer is large. Accordingly, the prior art photolithography regulates only the temperature of the developer to be sprayed over the work. However, it was found that the temperature of the developer drops about 6° C. during practical development, which is considered to be due mainly to the evaporation of the developer. It was also found that there is difference between the temperature of the developer in the central area of the work and that of the same in the peripheral area of the work. FIG. 2 shows the variation of the temperature of the developer with time in the central area of the work (solid circles) and in the peripheral area of the work (blank circles). As is obvious from FIG. 2, the temperature of the developer drops about 4° C. in 100 sec in both the central and peripheral areas of the work and about 6° C. in 300 to 600 sec in both the central and peripheral areas of the work, the temperature of the developer in the central area of the work and that of the same in the peripheral area of the work are different, and the mode of temperature variation of the developer in the central area of the work and that of the developer in the peripheral area of the work are different. The temperature difference between the developer in the central area of the work and developer in the peripheral area of the work is considered to be attributable to the following reasons that the temperature of the developer in the central area of the work does not drop rapidly because the central area of the work is in contact with the support 2, whereas the temperature of the developer in the peripheral area of the work drops rapidly because there is nothing around the peripheral area of the work. This temperature difference is unavoidable because the area of the work 1 is greater than that of the supporting surface of the support 2 as shown in FIG. 1b. The support 2 must be smaller than the work 1 to avoid interference between the support 2 and the wafer transporting mechanism to and to suppress wetting the support 2 with the developer to the least extent.

The width of a line of a resist film sensitive to temperature variation is smaller when the temperature of the developer is lower. FIG. 3a shows the width of a line of a resist film formed on a work at measuring points 1 to 7 (FIG. 3b) on the surface of the work. In FIG. 3a, curves IIa, IIb and IIc indicate the dependence of the width of lines on position on the work for resist films (FH-EX, Fuji Hunt Co.) developed by prior art developing processes, respectively. There is a tendency for the width to decrease from a portion of the line in the central area of the work toward a portion of the same in the peripheral area of the work. The difference in width between a portion of the line in the central area of the work and a portion of the same in the peripheral area of the work is in the range of about 0.04 $\mu$m to about 0.05 $\mu$m.

A resist for excimer laser lithography, which is capable of effectively coping with the miniaturization of semiconductor devices and with the increase of degree of integration large-scale integrated circuits, is one of the resists sensitive to the temperature variation of the developer. Therefore, it is important to solve the foregoing problems in developing a resist film.

The foregoing problems may be solved by supporting a work 1 on a support 2 of a size equal to or greater than that of the work 1 so that the work is entirely in contact with the support 2 as shown in FIG. 4. However, this resist film developing method is not necessarily able to eliminate the influence of the support 2 on the temperature variation of the developer retained on the work 1 and local temperature difference in the developer retained on the work 1 and is not a drastic means for solving such problems. Furthermore, such a large support, as compared with the work, places restrictions on the design of the work transporting system and is liable to be wetted with the developer, and hence the employment of such a large support is not practically disadvantageous.

SUMMARY OF THE INVENTION

Accordingly, it is an object of the present invention to provide a method of developing a resist film on a work, capable of maintaining uniform temperature distribution in a developer retained over the surface of the resist film, of developing the resist film at a constant developing speed and thereby improving the evenness of the width of lines of the resist film.

In one aspect of the present invention, a resist film developing method, which develops a resist film on a work, such as a wafer, supported on a support of a size smaller than that of the work by spreading a developer in a developer puddle over the surface of the resist film, separates the work from the support during the progress of development. Accordingly, the influence of the support on the progress of development can be eliminated, the temperature variation of the developer puddle and the temperature difference between portions of the developer puddle can be reduced and thereby the resist film can be uniformly developed.

In a second aspect of the present invention, a resist film developing method, which develops a resist film on a work and employs a puddle developing process, applies a developer to a resist film formed on a work after cooling the resist film by forming a puddle of pure water on the resist film.

In a third aspect of the present invention, a resist film developing method, which develops a resist film on a work and employs a puddle developing process, maintains a developer puddle formed on the resist film at a temperature higher than those of the work, a support supporting the work and the developing atmosphere.

In a fourth aspect of the present invention a resist film developing method, which develops a resist film on a work and employs a puddle developing process, forms a developer puddle over the surface of the resist film and placed a cover close to or in contact with the surface of the developer puddle during development.

BRIEF DESCRIPTION OF THE DRAWINGS

The above and other objects, features and advantages of the present invention will become more apparent from the following description taken in connection with the accompanying drawings, in which:

FIGS. 5a, 5b and 5c are diagrammatic views of assistance in explaining a resist film developing method in a first embodiment according to the present invention;

FIG. 6 is a diagrammatic view of assistance in explaining a resist film developing method in a second embodiment according to the present invention;

FIG. 12 is a flow chart of a prior art resist film developing method;

DETAILED DESCRIPTION OF THE PREFERRED EMBODIMENTS

The present invention will be described hereinafter as applied to a photolithographic process of forming a fine resist pattern in fabricating a minute semiconductor integrated circuit device.

First Embodiment

A resist FH-EX (Fuji Hunt Co.) is used for forming a resist film to be patterned with a laser beam emitted by an excimer laser. Although the resist FH-EX is capable of forming a fine resist pattern, the same is sensitive to temperature variation.

Figure 1A:
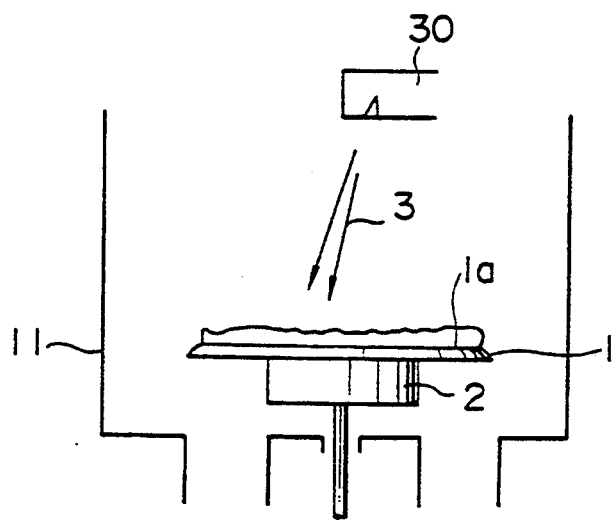
FIGS. 1a and 1b are diagrammatic views of assistance in explaining a prior art resist film developing method.
Figure 1B:
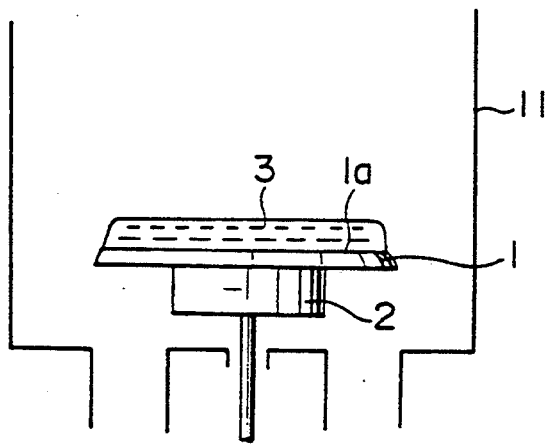
Figure 2:
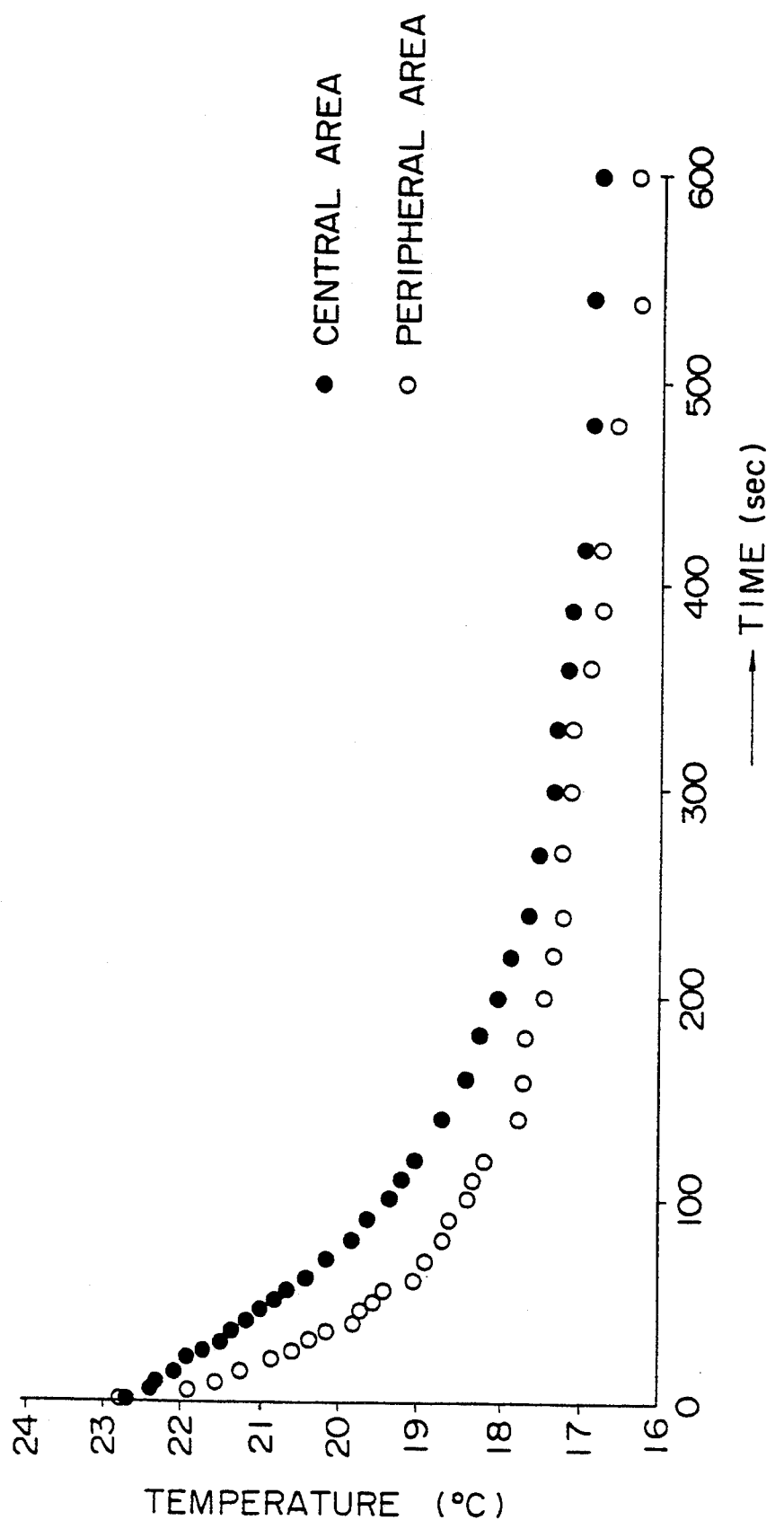
FIG. 2 is a graph showing the dependence of the temperature of a developer on position and the variation of the temperature of the developer with time in a resist film developing process of a prior art resist film developing method.
Figure 3A:
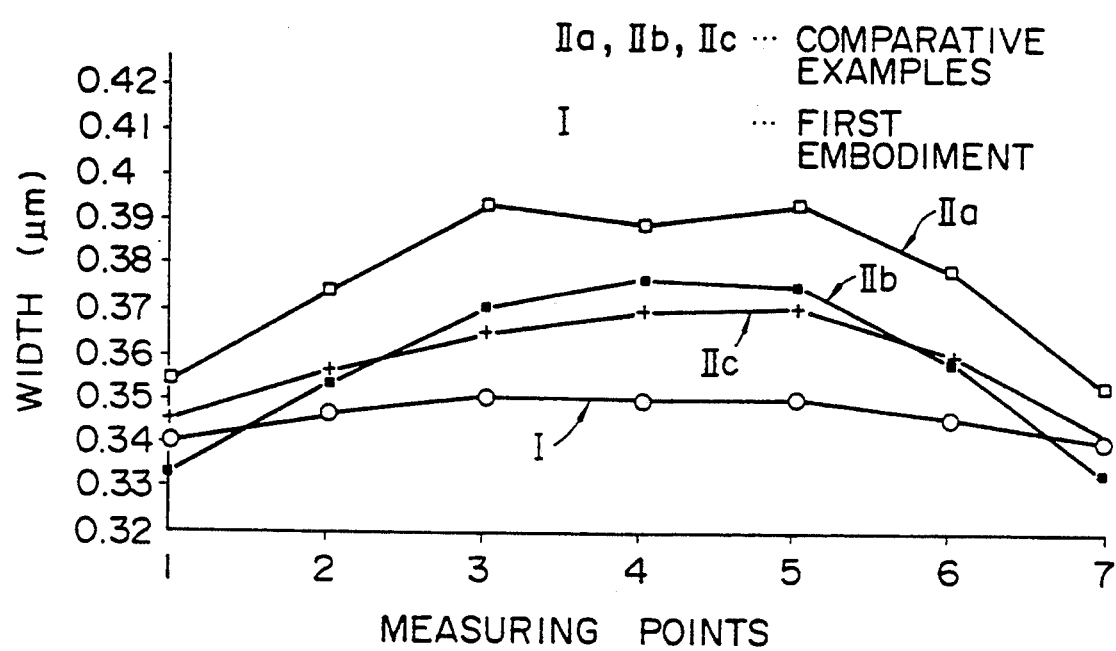
FIGS. 3a and 3b show the dependence of the width of lines of resist films on position on a work for prior resist film developing methods.
Figure 3B:
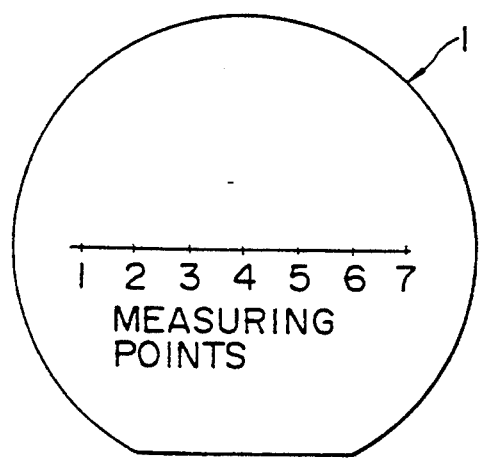
Figure 4:
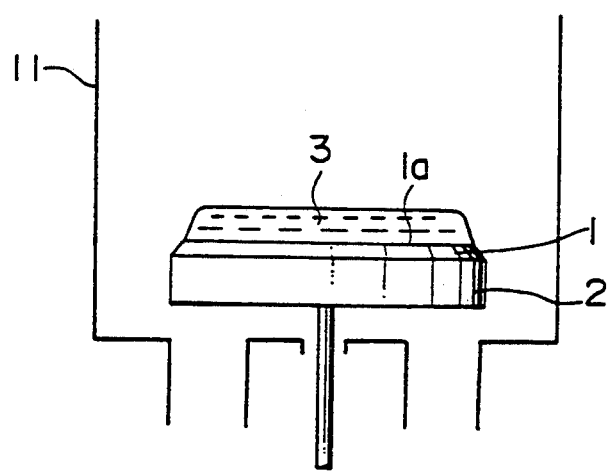
FIG. 4 is a diagrammatic view of assistance in explaining an improved prior art resist film developing method.

Referring to FIGS. 5a to 5c, a wafer 1 provided over its upper surface with a resist film 1a is fixedly supported on a suction wafer chuck 2 of a size smaller than that of the wafer 1. A developer 3 is sprayed by a nozzle 30 to spread the developer 3 in a developer puddle over the surface of the resist film 1a while the wafer chuck 2 fixedly supporting the wafer 1 is rotated as shown in FIG. 5a. After the wafer chuck 2 has been stopped, the developer 3 is retained in a puddle on the surface of the resist film 1a by surface tension as shown in FIG. 5b. Then, the suction of the wafer chuck 2 is removed to release the wafer 1, and then lifting pins 51a and 51b are raised to separate the wafer 1 from the wafer chuck 2. Thus, the wafer 1 is supported on the lifting pins 51a and 51b during the development of the resist film 1a. Since the wafer 1 is separated from the wafer chuck 2 during the progress of development, the development of the resist film 1a is not affected at all by the wafer chuck 2, the temperature distribution in the puddle of the developer 3 is uniform, all the portions of the resist film 1a are developed at equal developing speeds, and each of lines of the resist pattern has a uniform width. In FIG. 3a, a curve indicated at I represents the width of a line of the resist pattern developed by this method. As is obvious from FIG. 3a, the dependence of the width of the line on position on the wafer 1 is insignificant and the difference between the width of the line in the central area of the wafer 1 and that of the same in the peripheral area of the wafer 1 is on the order of 0.01 μm.

Second Embodiment

When the wafer 1 is supported by the lifting pins 51a and 51b during the resist film developing process, it is possible that the temperature of the lifting pins 51a and 51b decreases with the progress of the resist film developing process and the temperature of portions of the puddle of the developer 3A corresponding portions of the wafer 1 in contact with the lifting pins 51a and 51b drops accordingly, which affects adversely to the uniform development of the resist film.

As shown in FIG. 6 a resist film developing method in a second embodiment according to the present invention separates a wafer 1 from a wafer chuck 2 and supports the wafer 1 by lifting pins 51a and 51b during the resist film developing process, and adjusts the temperature of the lifting pins 51a and 51b to a predetermined temperature by a temperature regulating device 6a before starting each resist film developing cycle. In FIG. 6 indicated at 61 is water for adjusting the temperature of the lifting pins 51a and 51b to the predetermined temperature, and at 62a are heat exchangers.

Third Embodiment

Figure 7A:
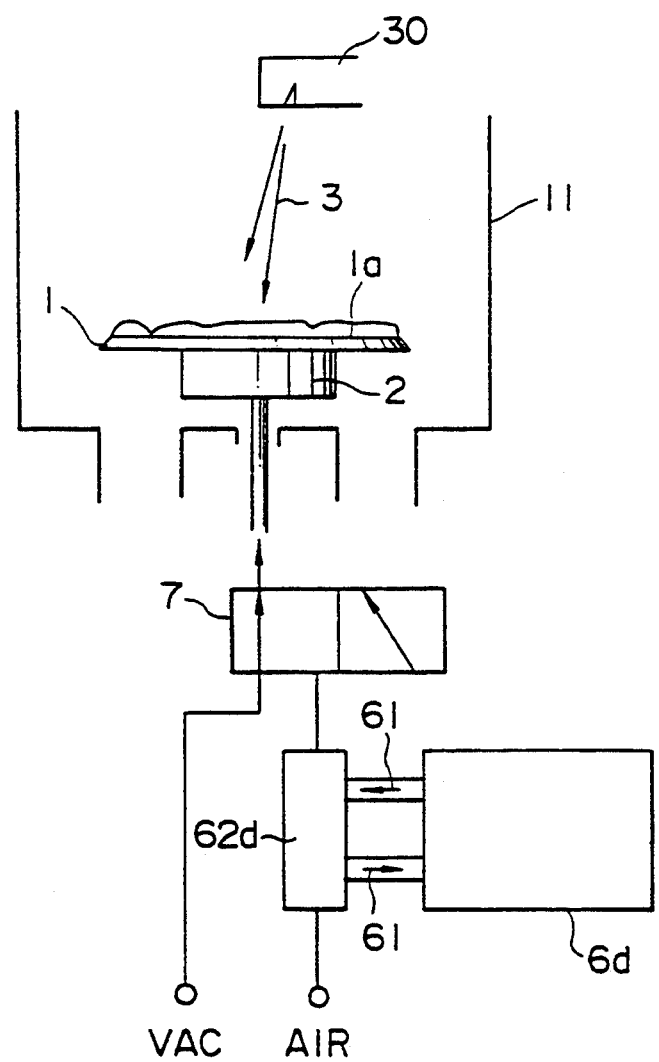
FIGS. 7a, 7b and 7c are diagrammatic views of assistance in explaining a resist film developing method in a third embodiment according to the present invention.
Figure 7B:
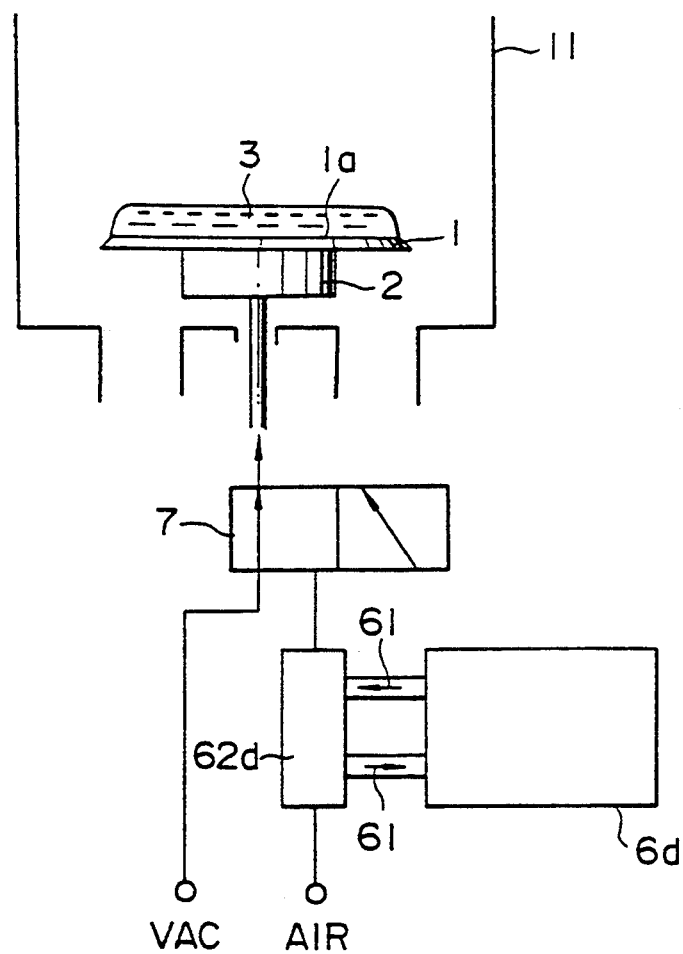
Figure 7C:
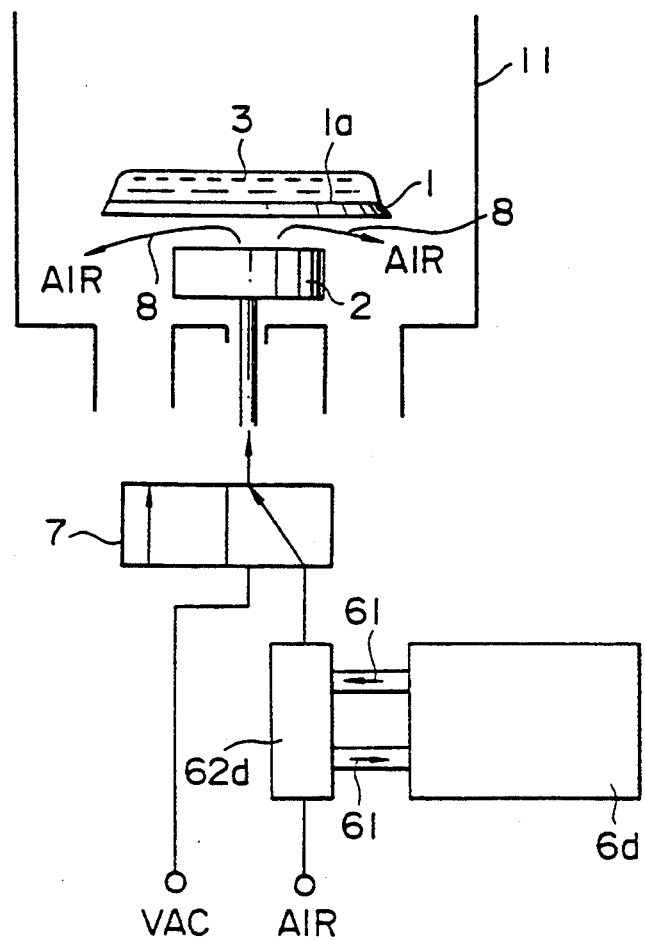

Referring to FIG. 7a, a wafer 1 provided on its upper surface with a resist film 1a is fixedly supported on a wager chuck 2 of a size smaller than that of the wafer 1. A developer 3 is sprayed by a nozzle 30 to spread the developer 3 in a developer puddle over the surface of the resist film 1a while the wafer chuck 2 fixedly supporting the wager 1 is rotated After the wafer chuck 2 has been stopped, the developer 3 is retained in a puddle on the surface of the resist film 1a by surface tension as shown in FIG. 7b to develop the resist film 1a. Then, as shown in FIG. 7c, a solenoid valve 7 is controlled so as to disconnect the wafer chuck 2 from a vacuum source Vac and to connect the same to a compressed air source Air, so that compressed air 8 is blown through the wafer chuck 2. Consequently, the compressed air 8 blown out from the wafer chuck 2 separates the wafer 1 from the wafer chuck 2 and holds the wafer 1 afloat above the wafer chuck 2.

Thus, temperature distribution in the wafer 1 is uniform during the developing process, so that the component lines of the resist film 1a are developed respectively at equal developing speeds.

Fourth Embodiment

Figure 8:
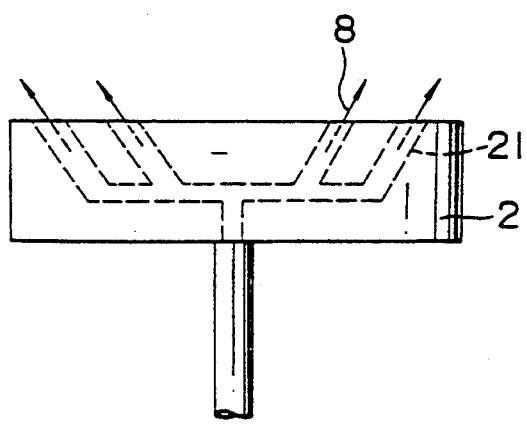
FIG. 8 is a diagrammatic view of assistance in explaining a resist film developing method in a fourth embodiment according to the present invention.

A resist film developing method in a fourth embodiment according to the present invention is a modification of the resist film developing method in the third embodiment. The resist film developing method in the fourth embodiment employs a wafer chuck 2 provided with air passages 21 inclined radially outward to the axis of the wafer shuck 2 as shown in FIG. 8 to blow compressed air 8 upward and radially outward along the backside of the wafer. The velocity of the compressed air 8 flowing along the backside of the wafer is higher than that of the compressed air 8 blown through the wafer chuck 2 employed in the third embodiment and flowing along the backside of the wafer 1. Therefore, the pressure prevailing in the space between the wafer chuck 2 and the wafer is reduced by the Venturi effect and the wafer is held afloat at a fixed height from the surface of the wafer chuck 2.

Fifth Embodiment

A resist film developing method in a fifth embodiment according to the present invention employs a resist film developing apparatus similar to that shown in FIG. 7a employed in carrying out the resist film developing method in the third embodiment.

Referring to FIG. 7a, a resist film developing apparatus employed in carrying out the resist film developing method in the fifth embodiment is provided additionally with a temperature regulating device 6d to regulate the temperature of the compressed air 8. The temperature regulating device 6d regulates the temperature of water 61 circulated through a heat exchanger 62d so that the temperature of the compressed air 8 flowing through the heat exchanger 62d is adjusted to that of the developing atmosphere.

Sixth Embodiment

A resist film developing method in a sixth embodiment according to the present invention reduces the temperature of a wafer provided with a resist film by forming a puddle of pure water on the resist film and cooling the wafer by the latent heat of evaporation of the pure water before applying a developer to the resist film.

Figure 10A:
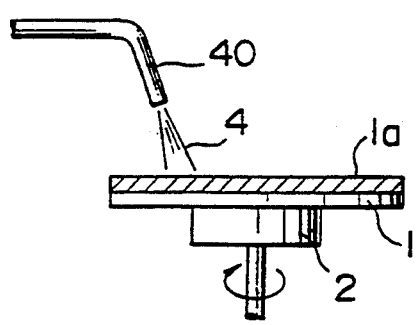
FIGS. 10a to 10e are diagrammatic views of assistance in explaining a resist film developing method in a sixth embodiment according to the present invention.
Figure 10B:
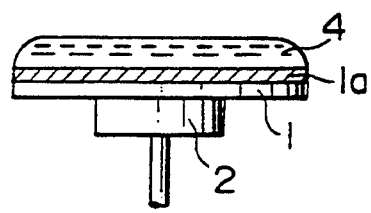

Referring to FIG. 10a, a wafer 1a provided with an exposed resist film 1a on its upper surface is fixedly mounted on a wafer chuck 2, pure water 4 is sprayed by a nozzle 40 over the surface of the resist film 1a while the wafer chuck 2 is rotated at a rotating speed in the range of 10 to 50 rpm for three to five seconds, and then the nozzle 40 is closed and the wafer chuck 2 is stopped. In this state, a puddle of the pure water 4 is formed on the resist film 1a as shown in FIG. 10b.

The wafer 1 is left as it is for about 300 sec to cool the wafer 1 and the Wafer chuck 2 gradually by the evaporation of the pure water 4. Consequently, the wafer 1 is cooled to, for example, 17° C. in uniform temperature distribution.

Figure 10C:
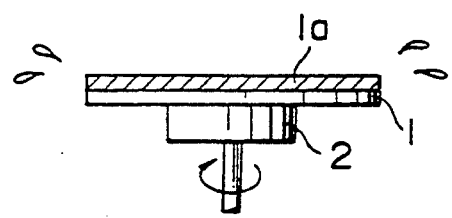
Figure 10D:
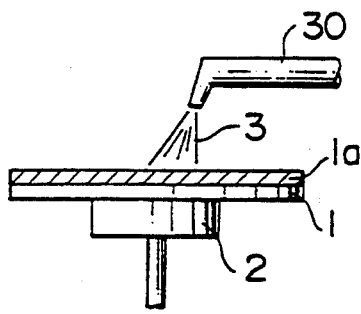
Figure 10E:
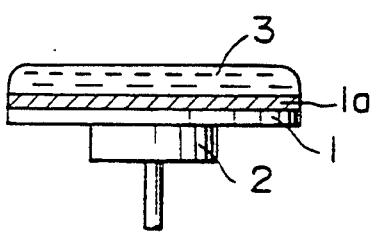

Then, the wafer chuck 2 is rotated at 4000 rpm for about 10 sec for spin drying to remove the puddle of the pure water 4 by centrifugal force as shown in FIG. 10c. Then, the surface of the resist film 1a is wetted with pure water while the wafer chuck 2 fixedly supporting the wager 1a is rotated at 1000 rpm for 3 sec. Subsequently, as shown in FIG. 10d, a developer 3 of, for example, 17° C. is sprayed by a developer spraying nozzle 30 over the resist film 1a to form a puddle of the developer 3 on the resist film 1a as shown in FIG. 10e. In this state, the wafer 1 is held stationary for about 40 sec to develop the resist film 1a. Then, the resist film 1a is rinsed with pure water for about 10 sec by spraying pure water over the surface of the resist film 1a while the wafer 1 is rotated at 1000 rpm. Then, the wafer chuck 2 is rotated at 4000 rpm for about 10 sec for spin drying.

Figure 11:
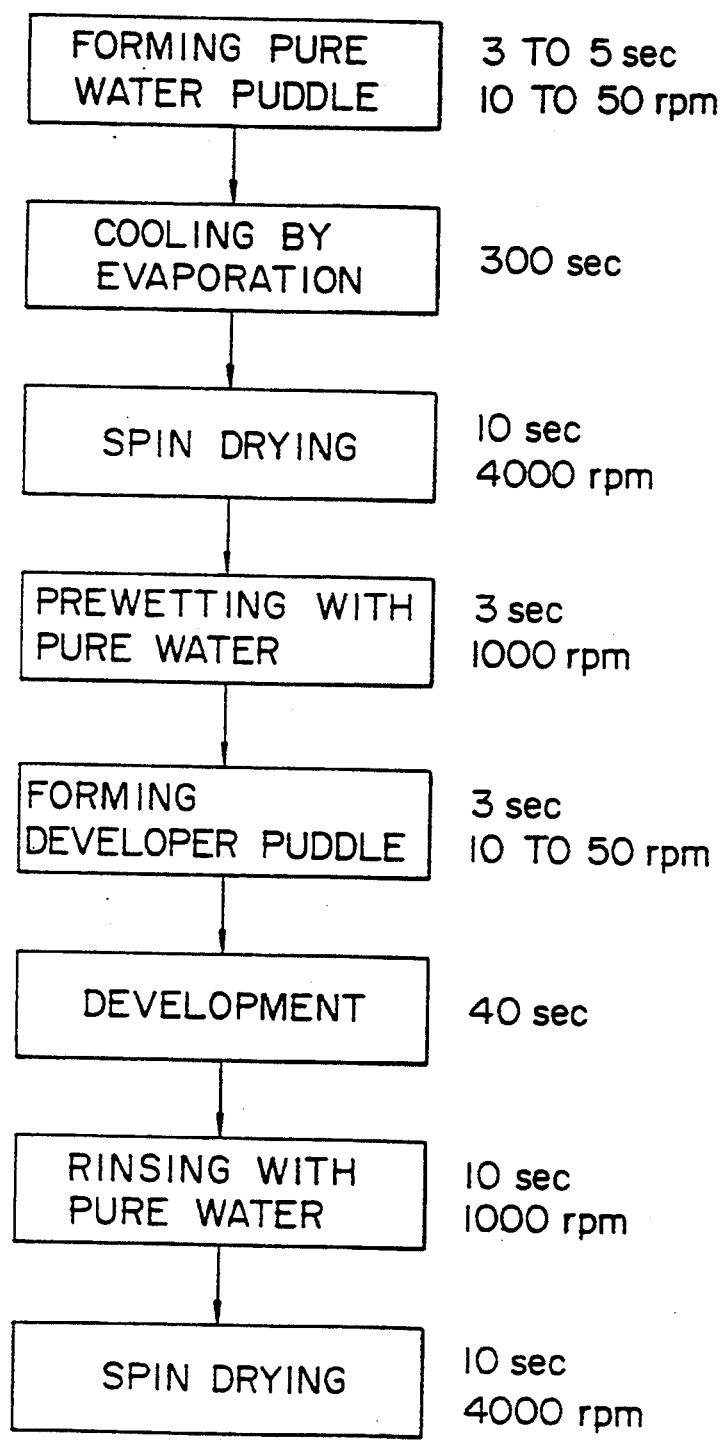
FIG. 11 is a flow chart of the resist film developing method in the sixth embodiment.

FIG. 11 is a flow chart showing the steps of the resist film developing method in the sixth embodiment and FIG. 12 is a flow chart showing the steps of the prior art resist film developing method, in which the wafer is not cooled before developing the resist film formed thereon.

Figure 13:
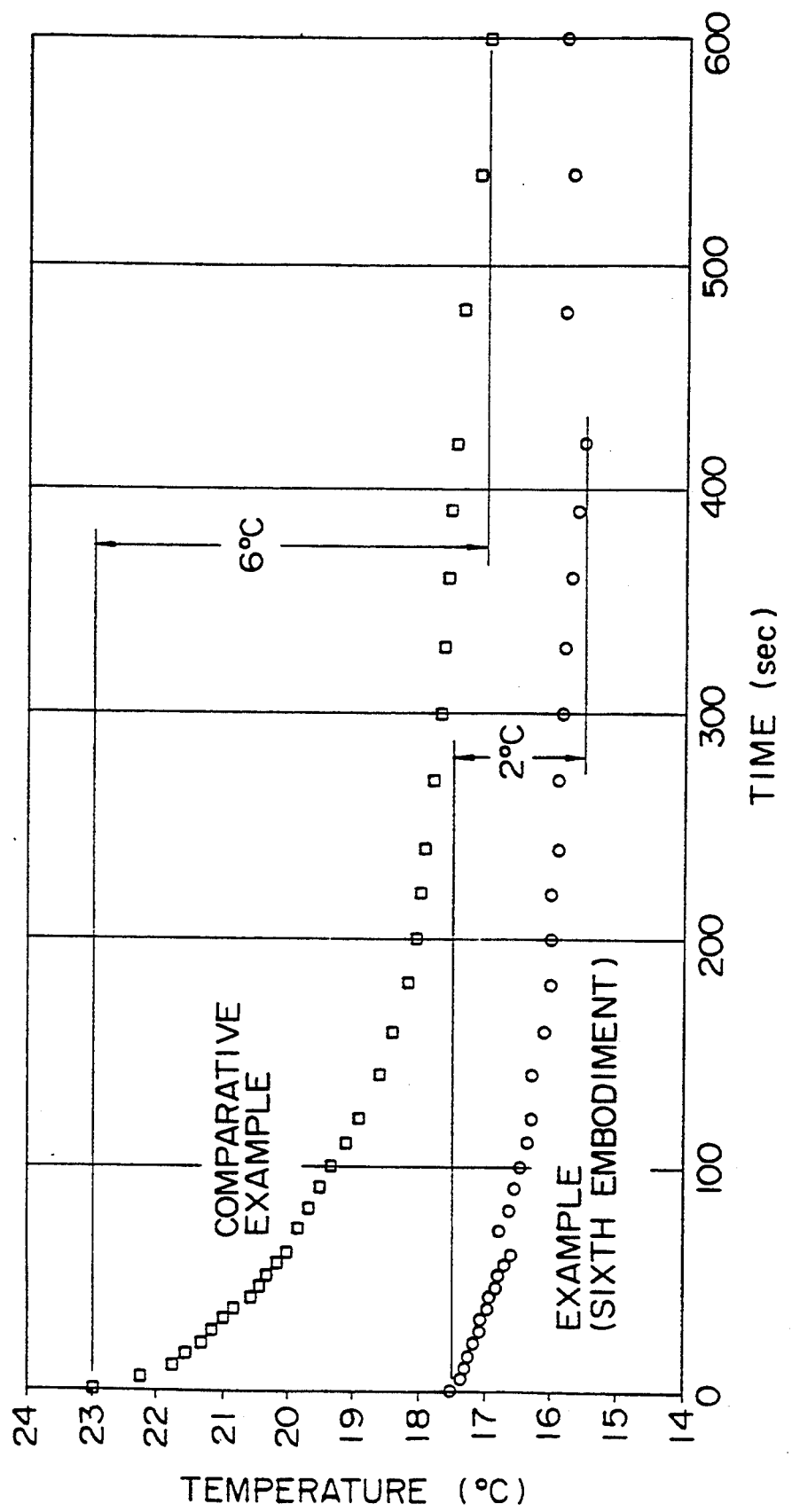
FIG. 13 is a graph showing the effect of the resist film developing method in the sixth embodiment, in comparison with that of a prior art resist film developing method, on the suppression of the drop of the temperature of a developer puddle.

As is obvious from FIG. 13, the temperature of the developer drops by about 2° C. during the developing process of the resist film developing method in the sixth embodiment, whereas the temperature of the developer drops by about 6° C. during the developing process of the prior art resist film developing method.

Figure 14:
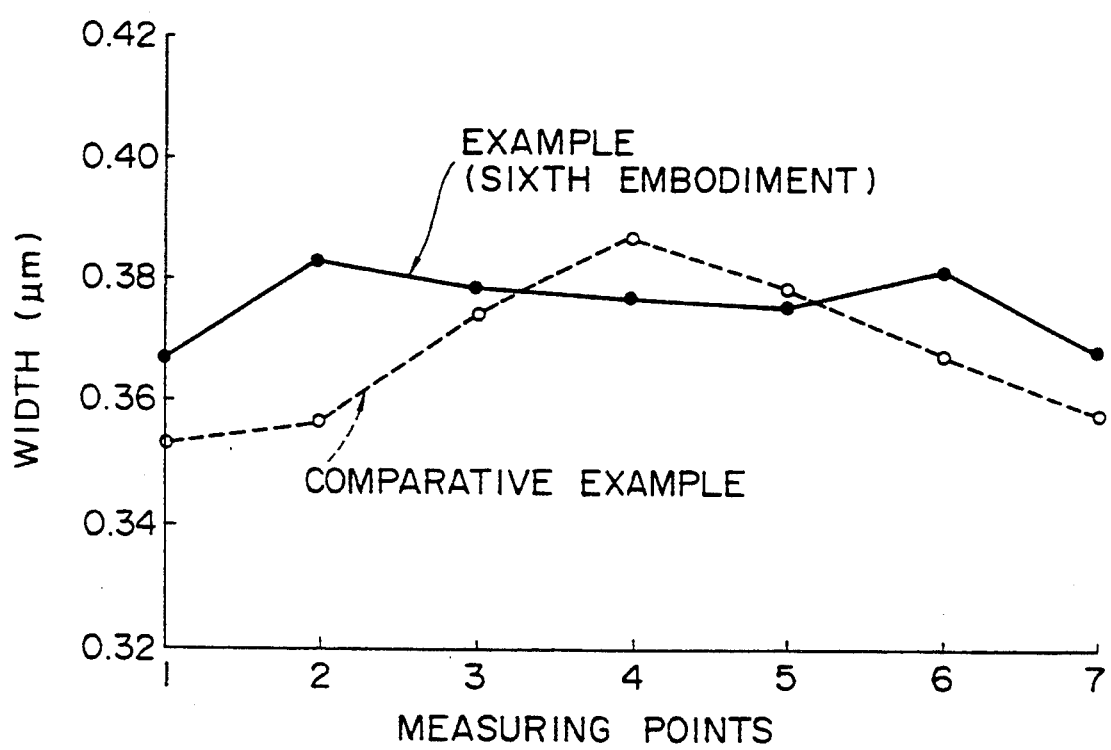
FIG. 14 is a graph showing the width of lines of resist films developed respectively by the resist film developing method in the sixth embodiment according to the present invention and a prior art resist film developing method.

FIG. 14 shows the thickness of a line of the developed resist film developed by the resist film developing method in the sixth embodiment and that of a line of the developed film developed by the prior art resist film developing method. The thickness was measured at seven different measuring points. As is obvious from FIG. 14, the width of the line of the resist film developed by the resist film developing method in the sixth embodiment is more uniform than that of the line of the resist film developed by the prior art resist film developing method.

In comparing the effect of the resist film developing method in the sixth embodiment and that of the prior art resist film developing method, 2.38% NMD-3 (ammonium hydroxide) solution was used as a developer, and wafer chucks formed of Delrin were used.

Seventh Embodiment

A resist film developing method in a seventh embodiment according to the present invention is similar to that in the sixth embodiment, except that the resist film developing method in the seventh embodiment uses pure water of a temperature lower than that of a wafer 1 and a wafer chuck 2 by 5° C.

Figure 9:
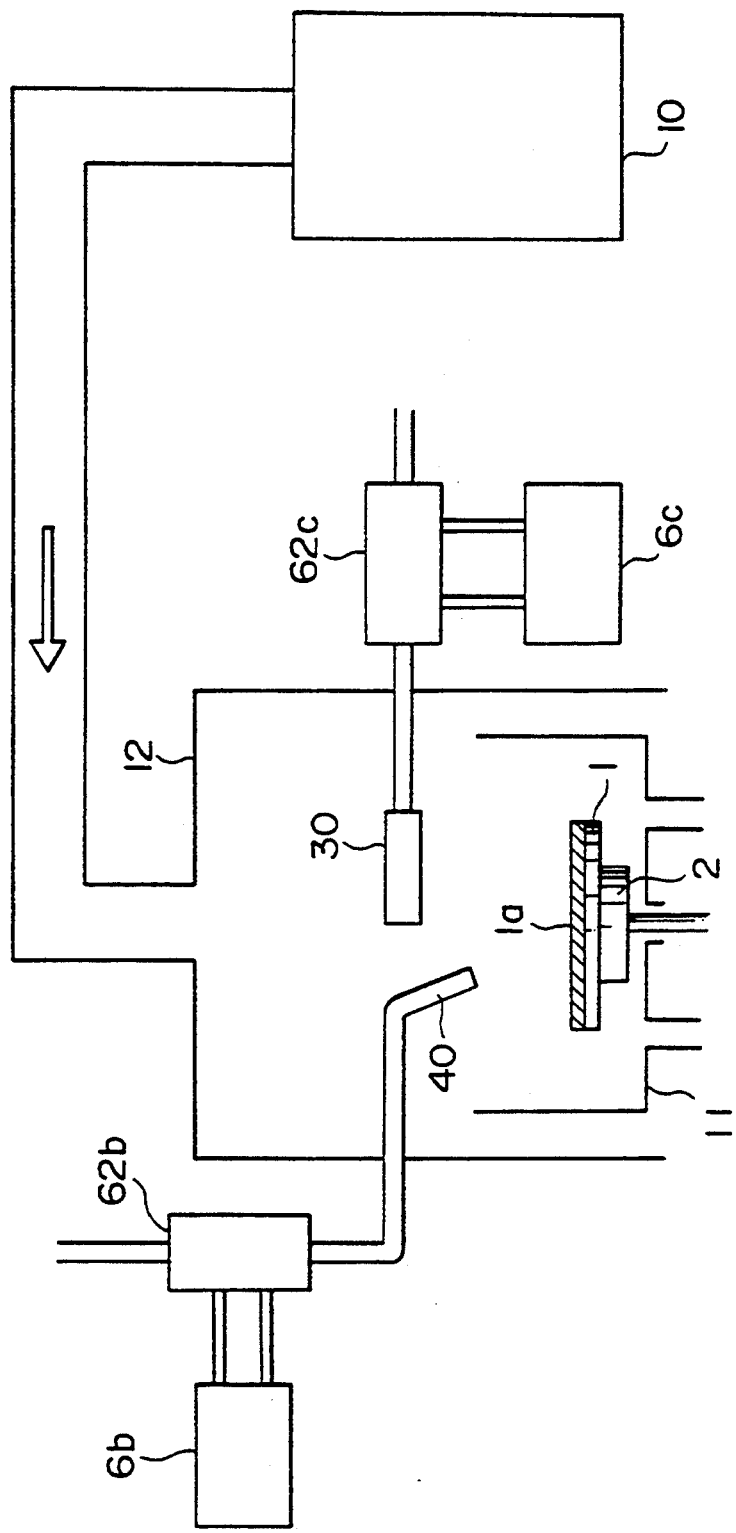
FIGS. 9 is a diagrammatic view of a resist film developing apparatus for carrying out the present invention.

Referring to FIG. 9 showing a resist film developing apparatus for carrying out the resist film developing method in the seventh embodiment, a wafer 1 provided on its upper surface with a resist film 1a is fixedly supported on a wafer chuck 2. Pure water is poured on to the wafer 1 to cool the wafer 1 and the wafer chuck 2. Water of a temperature regulated by a temperature regulating device 6b exchanges heat in a heat exchanger 62b with the pure water to cool the pure water to a temperature lower than that of the wafer 1 and the wafer chuck 2. Accordingly, the wafer 1 and the wafer chuck 2 are cooled efficiently to a desired temperature in a time interval shorter than 300 sec.

When the temperature regulating device 6b was adjusted so as to cool the pure water to 18° C., the wafer 1 and the wafer chuck 2 were cooled to 17° C. in 100 sec.

After the wafer 1 and the wafer chuck 2 have been cooled to the desired temperature, the pure water is removed from the surface of the resist film 1a by the same spin-drying method employed in the resist film developing method in the sixth embodiment. Then, a developer is sprayed over the surface of the resist film 1a by a developer spraying nozzle 30. The developer is passed through a heat exchanger 62c to make the developer exchange heat with water of a temperature regulated by a temperature regulating device 6c to adjust the temperature of the developer to a desired temperature before the developer is supplied to the developer spraying nozzle 30. During the developing process, the temperature and humidity of the developing atmosphere are controlled by a temperature/humidity controller 10. In FIG. 9, indicated at 11 is a developing cup for collecting the pure water and the developer, and at 12 is a hood covering the developing cup 11.

Eighth Embodiment

A resist developing method in an eighth embodiment according to the present invention employs the resist film developing apparatus shown in FIG. 9. The resist film developing method cools a wafer 1 provided on its upper surface with a resist film 1a by a wafer temperature regulating device, not shown, before the development of the resist film 1a. For example, the wafer 1 is cooled to 17° C. Then, the cooled wafer 1 is held fixedly by the wafer chuck 2 in the developing cup 11 (FIG. 9). The wafer chuck 2 is cooled by the wafer 1. In this embodiment, the wafer 1 can be cooled to 17° C. in 200 sec.

Ninth Embodiment

A resist film developing method in a ninth embodiment according to the present invention uses a developer of a temperature higher than that of a wafer and a wafer chuck supporting the wafer. For example, the temperature of the developer is 23° C. when the temperature of the wafer and the wafer chuck is 17° C.

When a puddle of the developer is formed on the wafer, the temperature of the peripheral portion of the wafer rises rapidly to a temperature near that of the developer, for example, 23° C., where as the temperature of the central portion of the wafer in contact with the wafer chuck rises gradually to a temperature in the range of, for example, 18° C. to 20° C. Accordingly, in the initial stage of the developing process, the developing speed in the central portion of the wafer is higher than that in the peripheral portion of the wafer, because the developing speed is higher when the temperature of the wafer is lower. The temperature of the wafer drops gradually due to the evaporation of the developer with the progress of the developing process. The rate of temperature drop in the central portion of the wafer is lower than that in the peripheral portion of the wafer, because the central portion of the wafer is in contact with the wafer chuck. Accordingly, the developing speed in the peripheral portion of the wafer becomes higher than that in the central portion of the wafer in the final stage of the developing process. Thus, the average developing speed for the peripheral portion of the wafer and that for the central portion of the wafer are substantially equal to each other.

Figure 15:
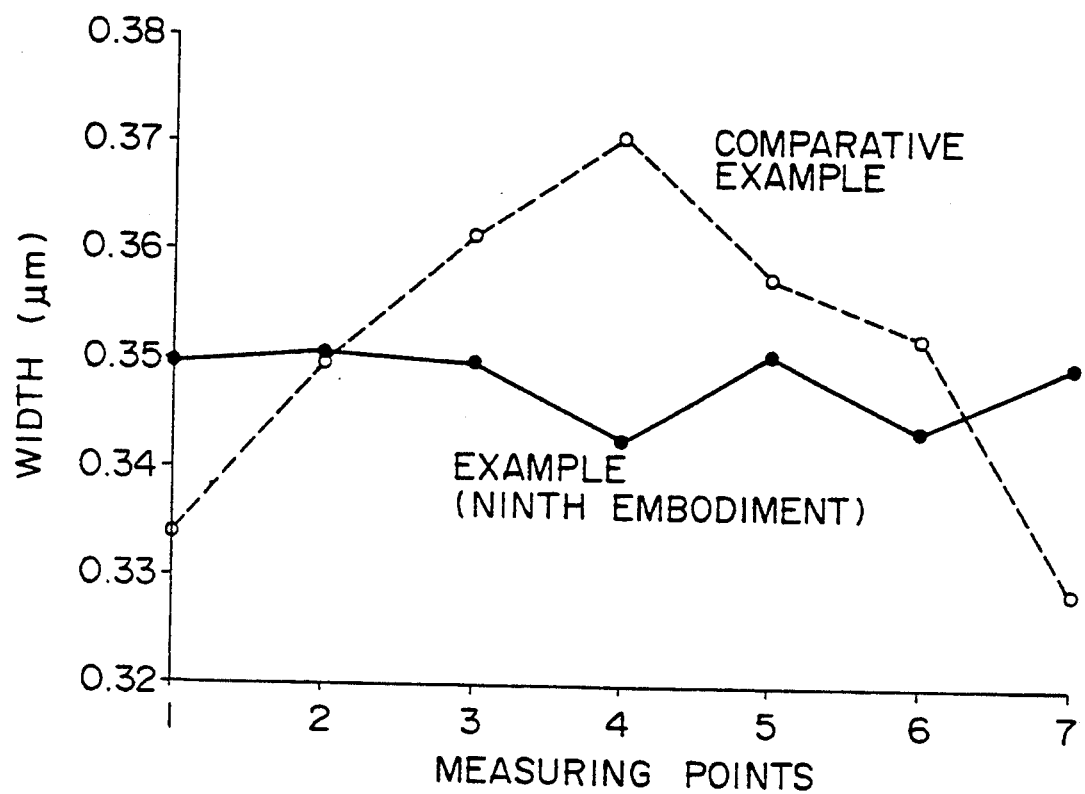
FIG. 15 is a graph showing the width of lines of resist films developed respectively by a resist film developing method in a ninth embodiment according to the present invention and a prior art resist-film developing method.

FIG. 15 shows the effect of the resist developing method in the ninth embodiment, in comparison with that of the prior art resist film developing method, in terms of the width of a line of the resist film measured at seven measuring points. As is obvious from FIG. 15, the difference between the maximum width and the minimum width of the line of the resist film developed by the resist film developing method in the ninth embodiment is about 0.008 $\mu$m, whereas the corresponding difference in the resist film developed by the prior art resist film developing method is as large as 0.042 $\mu$m.

This embodiment heats the developer to a temperature higher than that of the wafer and the wafer chuck instead of cooling the wafer and the wafer chuck to a temperature lower than that of the developer. Preferably, the temperature of the developer is higher than that of the wafer, the wafer chuck and the developing atmosphere by a temperature difference in the range of 5° C. to 10° C.

Tenth Embodiment

A resist film developing method in a tenth embodiment according to the present invention suppresses the evaporation of the developer during the developing process.

Figure 16A:
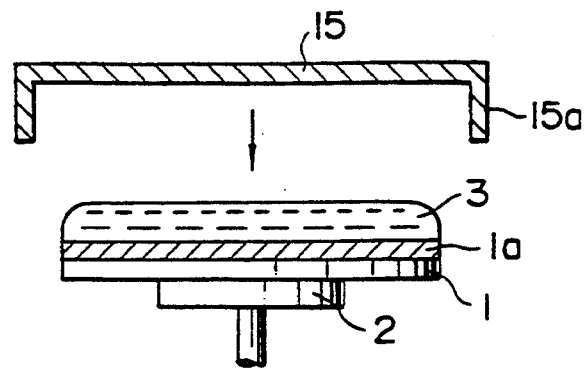
FIGS. 16a and 16b are diagrammatic views of assistance in explaining a resist film developing method in a tenth embodiment according to the present invention.
Figure 16B:
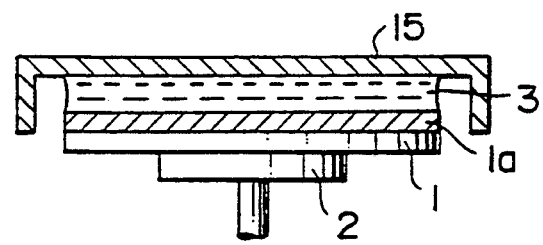

Referring to FIG. 16, a wafer 1, such as a semiconductor wafer, provided on its upper surface with an exposed resist film 1a is fixedly supported on a wafer chuck 2, and then a developer is sprayed over the surface of the resist film 1a to form a developer puddle 3. Then, a cover 15 formed of polytetrafluoroethylene or a stainless steel and having a side wall 15a is lowered toward the wafer 1 supported on the wafer support 2 as shown in FIG. 16a, and the cover 15 is brought into contact with the developer puddle 3 as shown in FIG. 16b. The side wall 15a of the cover 15 surrounds the developer puddle 3. The cover 15 may be held above the developer puddle 3 at a distance small enough for the cover 15 to suppress the evaporation of the developer effectively, for example, 10 mm or less, instead of being brought into contact with the developer puddle 3. Thus, the cover 15 suppresses the evaporation of the developer, thereby suppressing the drop of the temperature of the developer puddle 3.

Eleventh Embodiment

A resist developing method in an eleventh embodiment according to the present invention, similarly to the resist developing method in the tenth embodiment, suppresses the evaporation Of the developer.

Figure 17A:
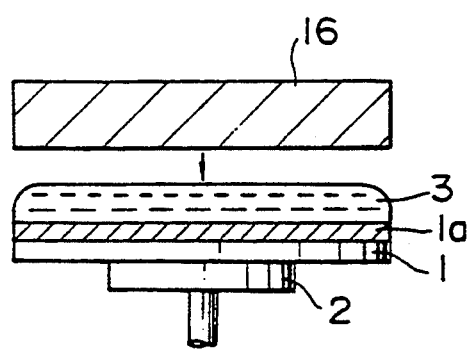
FIGS. 17a and 17b are diagrammatic views of assistance in explaining a resist film developing method in an eleventh embodiment according to the present invention.
Figure 17B:
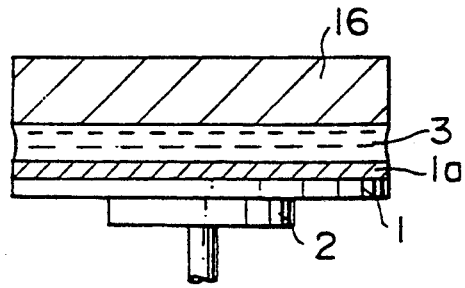

A wafer 1 provided on its upper surface with an exposed resist film 1a is fixedly supported on a wafer chuck 2, and a developer is sprayed over the resist film 1a to form a developer puddle 3 on the resist film 1a as shown in FIG. 17a. A constant-temperature plate 16 is brought into contact with the developer puddle 3 as shown in FIG. 17b or held above the developer puddle 3 at a distance not greater than 10 mm form the surface of the developer puddle 3. The constant-temperature plate 16 maintains the developer puddle 3 at a temperature in the range of about 20° C. to about 25° C. and suppresses the evaporation of the developer.

As is apparent from the foregoing description, the resist film developing method in accordance with the present invention keeps a uniform temperature throughout the developer puddle formed on the resist film, suppresses the variation of the temperature of the developer puddle and enables all the portions of the resist film to be developed at a uniform developing speed, thereby forming each of lines of the resist film in a uniform width.

Although the invention has been described in its preferred forms with a certain degree of particularity, obviously many changes and variations are possible therein. It is therefore to be understood that the present invention may be practiced otherwise than as specifically described herein without departing from the spirit and scope thereof.

What is claimed is:

1. A method of developing an exposed resist film formed over a major surface of a substrate, said method comprising:
    holding the substrate carrying the resist film in contact with a supporting surface of a supporting member, said supporting surface having an area smaller than the surface area of the substrate;
    supplying a developer onto the resist film so that the developer is retained in a developer puddle by surface tension on the surface of the resist film to develop the resist film;
    separating the substrate carrying the resist film from the supporting member during the progress of the development of the resist film for preventing temperature variations in the resist film.

2. A method of developing an exposed resist film according to claim 1, wherein the step of separating the substrate carrying the resist film from the supporting member is by separately supporting the substrate off of the supporting member by supporting means having substantially point-contact with the substrate during the progress of the development of the resist film.

3. A method of developing an exposed resist film according to claim 2, wherein the temperature of the separating means can be regulated.

4. A method of developing an exposed resist film according to claim 1, wherein the step of separating the substrate carrying the resist film from supporting member is by lifting the substrate from the supporting member by a gas blown out through the supporting member during the progress of the development of the resist film.

5. A method of developing an exposed resist film according to claim 1, wherein the step of separating the substrate carrying the resist film is to support the substrate separately from the supporting member by a gas blown out through the supporting member in directions oblique to the surface of the substrate during the progress of the development of the resist film.

6. A method of developing an exposed resist film according to any one of claims 4 or 5, wherein the temperature of the gas blown through the supporting member is substantially equal to that of the atmosphere surrounding the substrate.

7. A method of developing an exposed resist film formed over a major surface of a substrate, said method comprising:
    holding the substrate carrying the resist film by a first supporting member having a contact area with the substrate smaller than the surface area of the substrate;
    supplying a developer onto the resist film so that the developer is retained in a developer puddle by surface tension on the surface of the resist film to develop the resist film;
    engaging the substrate carrying the resist film with second supporting members having a substantially point-contact area with the substrate;
    relatively moving the first and second supporting members to separate the substrate engaged by second supporting member from the first supporting members during the progress of the development of the resist film for preventing a temperature variation of the resist film; and
    engaging and supporting the substrate by the first supporting member after the development of the resist film.

8. A method of developing an exposed resist film formed over a major surface of a substrate, said method comprising:
    holding the substrate carrying the resist film by a first supporting member having a contact area with the substrate smaller than the surface area of the substrate;
    supplying a developer onto the resist film so that the developer is retained in a developer puddle by surface tension on the surface of the resist film to develop the resist film;
    supporting the substrate carrying the resist film by a gas blown out through first supporting member;
    separating the substrate supported by the gas from the first supporting member during the progress of the development of the resist film for preventing a temperature variation of the resist film; and
    engaging and supporting the substrate by the first supporting member after the development of the resist film, wherein the gas blown through the supporting member is substantially equal to that of the atmosphere surrounding the substrate.

9. A method of developing an exposed resist film formed over a major surface of a substrate, said method comprising:
    holding the substrate carrying the resist film in contact with a supporting surface of a supporting member, said supporting surface having an area smaller than the surface area of the substrate; and
    supplying a developer onto the resist film so that the developer is retained in a developer puddle by surface tension on the resist film to develop the resist film;

wherein the temperature of the substrate carrying the resist film is lower than that of the developer supplied onto the resist film for preventing a temperature variation in the resist film.

10. A method of developing an exposed resist film according to claim 9, wherein the substrate carrying the resist film is cooled before supplying the developer onto the resist film.

11. A method of developing an exposed resist film according to claim 9, wherein the difference between the temperature of the substrate carrying the resist film and that of the developer is in the range of 5° C. to 10° C.

12. A method of developing an exposed resist film according to claim 9, which after the step of supplying a developer onto the resist film includes a step of covering the substrate carrying the exposed resist film by a covering member for suppressing a evaporation of the developer puddle and preventing a temperature variation of the resist film.

13. A method of developing an exposed resist film according to claim 12, wherein the covering member is maintained at substantially a constant temperature.

14. A method of developing an exposed resist film formed over a major surface of a substrate, said method comprising steps of:
holding the substrate carrying the resist film in contact with a supporting surface of a supporting member, said supporting surface having an area smaller than the surface area of the substrate;
supplying pure water onto the surface of the resist film so that the pure water is retained on the surface of the resist film;
leaving the substrate with the retained water to cool the substrate and the resist film by the evaporation of the pure water retained on the surface of the resist film and for preventing any temperature variations in the resist film;
removing the pure water remaining on the surface of the resist film; and
supplying a developer onto the resist film so that the developer is retained in a developer puddle by surface tension on the surface of the resist film to develop the resist film.

15. A method of developing an exposed resist film according to claim 14, wherein the temperature of pure water to be supplied onto the surface of the resist film is adjusted to a temperature lower than that of the substrate carrying the resist film and the supporting member by 5° C. or higher.

16. A method of developing an exposed resist film formed over a major surface of a substrate, said method comprising:
holding the substrate carrying the resist film in contact with a supporting surface of a supporting member, said supporting surface having an area smaller than the surface of the substrate;
supplying a developer onto the resist film so that the developer is retained in a developer puddle by surface tension on the surface of the resist film to develop the resist film; and
covering the substrate carrying the resist film by a covering member after supplying the developer onto the resist film for suppressing the evaporation of the developer and for preventing a temperature variation of the resist film.

17. A method of developing an exposed resist film according to claim 16, wherein the covering member is in contact with the developer puddle.

* * * * *